United States Patent [19]

Ramsden et al.

[11] 4,395,630
[45] Jul. 26, 1983

[54] PHOTOELECTRIC MEASURING RULER INCLUDING FAULT DETECTION APPARATUS

[75] Inventors: Paul N. Ramsden, Leamington Spa; Michael H. Groves, Warwick, both of England

[73] Assignee: Stanley Tools Limited, Woodside, England

[21] Appl. No.: 226,388

[22] Filed: Jan. 19, 1981

[30] Foreign Application Priority Data

Jan. 18, 1980 [GB] United Kingdom ............... 8001734

[51] Int. Cl.³ .................. G01B 3/02; G01B 11/02; H01J 3/14
[52] U.S. Cl. .................. 250/237 G; 356/373; 33/140
[58] Field of Search ........... 250/237 R, 237 G, 231 R, 250/231 SE; 356/373, 374, 375; 324/175; 340/347 P; 33/139, 140

[56] References Cited

U.S. PATENT DOCUMENTS

| | | | |
|---|---|---|---|
| 4,079,252 | 3/1978 | Brake | 250/237 G |
| 4,152,579 | 5/1979 | Feinland | 250/237 G X |
| 4,180,704 | 12/1979 | Pettit | 250/237 G |
| 4,318,617 | 3/1982 | Orsen | 356/373 |

Primary Examiner—David C. Nelms
Assistant Examiner—Edward P. Westin
Attorney, Agent, or Firm—Prutzman, Kalb, Chilton & Alix

[57] ABSTRACT

A measuring rule has a coilable steel measuring blade extensible through an opening in a housing and is marked along its length with regularly spaced dark areas separated by light areas. Two pairs of light sensors are located near the rule each associated with a light emitter. Each sensor is 180° out of phase with the other sensor of the pair and 90° out of phase with the other two sensors. The outputs of each pair of sensors are used to produce a difference signal. The difference signals are used by a counter to measure the magnitude and direction of movement of the blade. Each sensor output signal is divided by voltage divider to give a divided signal and each sensor output signal is compared with the complementary divided signal at the instant the difference signal of the other pair of sensors changes state and a fault signal is generated if its minimum is larger than the maximum of the complementary divided signal. The fault signal is generated when an abnormal deviation in a sensor output signal occurs even if the deviation is insufficient to cause a count error.

9 Claims, 11 Drawing Figures

PHOTOELECTRIC MEASURING RULER INCLUDING FAULT DETECTION APPARATUS

This invention relates to a displacement measuring system having a member which is relatively movable in relation to a pair of sensors so that relative movement of the member in a given direction produces a number of cyclical variations of an output signal from each sensor, the number being proportional to the magnitude of relative movement.

An example of such a displacement measuring system is a measuring rule which has a measuring member in the form of a coilable steel measuring rule blade which is adapted to be coiled in the conventional manner inside a housing, when not in use, and which can be extended through an opening in the housing when it is required to be used as with a conventional measuring rule. The blade is marked along its entire length with a series of regularly spaced apart elements which are dark, light-absorbing areas with the spaces between the dark areas being light reflecting areas. Two light emitters are provided, each light emitter being associated with a light sensor and cooperating with the rule so that cyclical variations occur in the output of each light sensor. The term light is to be understood to include infra-red radiation.

It is a problem with a displacement measuring system which has alternate light and dark areas on a measuring member to be moved relative to a sensor that dirt on the measuring member may cause an erroneous output and this is discussed in U.S. Pat. Nos. 3,229,103, 3,364,359 and 4,079,252 although the possibility occurs in any system which counts cyclical variations of a signal output, however those cyclical variations are generated. In U.S. Pat. No. 3,229,103 there are provided two photoelectric cells one on each side of a measuring scale so that one receives reflected light and the other transmitted light. The cells should produce complementary signals and a circuit detects when the signals are non-complementary. Such a system will only detect a major fault.

It is an object of this invention to provide a displacement measuring system which includes means for detecting an abnormal deviation in a cyclical variation of an output signal of a sensor.

According to this invention there is provided a displacement measuring system comprising a pair of sensors arranged in fixed relationship to each other; a member which is relatively movable in relation to each sensor and which is arranged to be sensed by each sensor so that relative movement of the member in a given direction produces a number of cyclical variations of a signal output from each sensor, the number being proportional to the magnitude of the relative movement; the sensors being substantially 180° out of phase with each other so that when the signal from each sensor is at its high value the signal from the other sensor is at its low value and vice versa; difference measuring means connected to the sensors for producing a difference signal in dependence on the signals of the sensors; counting means connected to the difference measuring means and responsive to the difference signal for counting its cycles to determine the magnitude of relative movement of said member; and sampling means for sampling the signals from the two sensors during the time that one is at its high value and the other is at its low value and vice versa and for generating a fault signal if the ratio of the magnitudes of the two signals at a sample lies outside a predetermined range.

The fault signal is generated in the event of an abnormal deviation in a cyclical variation of an output signal of one of the sensors and the fault signal is generated even if the deviation is not sufficiently large to cause an error in the count.

In a preferred embodiment, the sensors are light sensors and the member is adapted to cyclically modify the light received by the sensors. In this case, the sampling means will generate a fault signal if the light path to one of the sensors is blocked in any way, e.g. by dirt.

In one embodiment of the invention, the member is provided with a series of light-transmitting regions alternating with a series of dark light-absorbing regions.

Alternatively, the member is provided with a series of light-reflecting regions alternating with a series of non-reflecting regions.

The system preferably comprises at least one further pair of sensors, sensors of mutually different pairs being out of phase with each other by a phase angle substantially different from 0° and 180°, difference measuring means being provided for each pair of sensors; and direction detecting means connected to the difference measuring means for determining the direction of relative movement of the member.

Preferably, the sensors are four in number and are arranged in two pairs, one pair being in phase quadrature relationship with the other pair.

It is preferred that sampling means is triggered to take a sample for one pair of sensors in response to a change in polarity of the difference signal produced by the difference measuring means connected to the other pair of sensors.

In an embodiment which comprises only one pair of sensors, the sampling means comprises a voltage divider connected between the output of each sensor and a reference voltage, the voltage dividers being similar, and first and second comparators, the first comparator being connected to receive the output of one sensor and the output of the voltage divider connected to the other sensor, the second comparator being connected to receive the output of the said other sensor and the output of the voltage divider connected to the said one sensor, means for detecting when the output of either of the sensors is at a maximum while the other is at a minimum, and for producing a sampling signal when that occurs, and means for detecting when the outputs of the two comparators have the same state in the presence of a sampling signal.

In a preferred arrangement applicable when the sensors are arranged in two pairs, the sampling means comprises a voltage divider connected between the output of each sensor of each pair and a common reference potential, the voltage dividers being similar, and means for generating a sampling signal when the difference signal of that pair of sensors changes state, first and second comparators, said first comparator being connected to receive the output of one sensor of the pair and the output of the voltage divider connected to the other sensor of the pair and the second comparator being connected to receive the output of the said other sensor of the pair and the output of the voltage divider connected to the said one sensor of the pair, and sensing means for sensing when the output of the two comparators associated with that pair of sensors have the same state at the instant of generation of the sampling signal associated with the other pair of sensors.

A measuring rule in accordance with this invention will now be described, by way of example only, with reference to the accompanying drawings of which:

Figure 1:
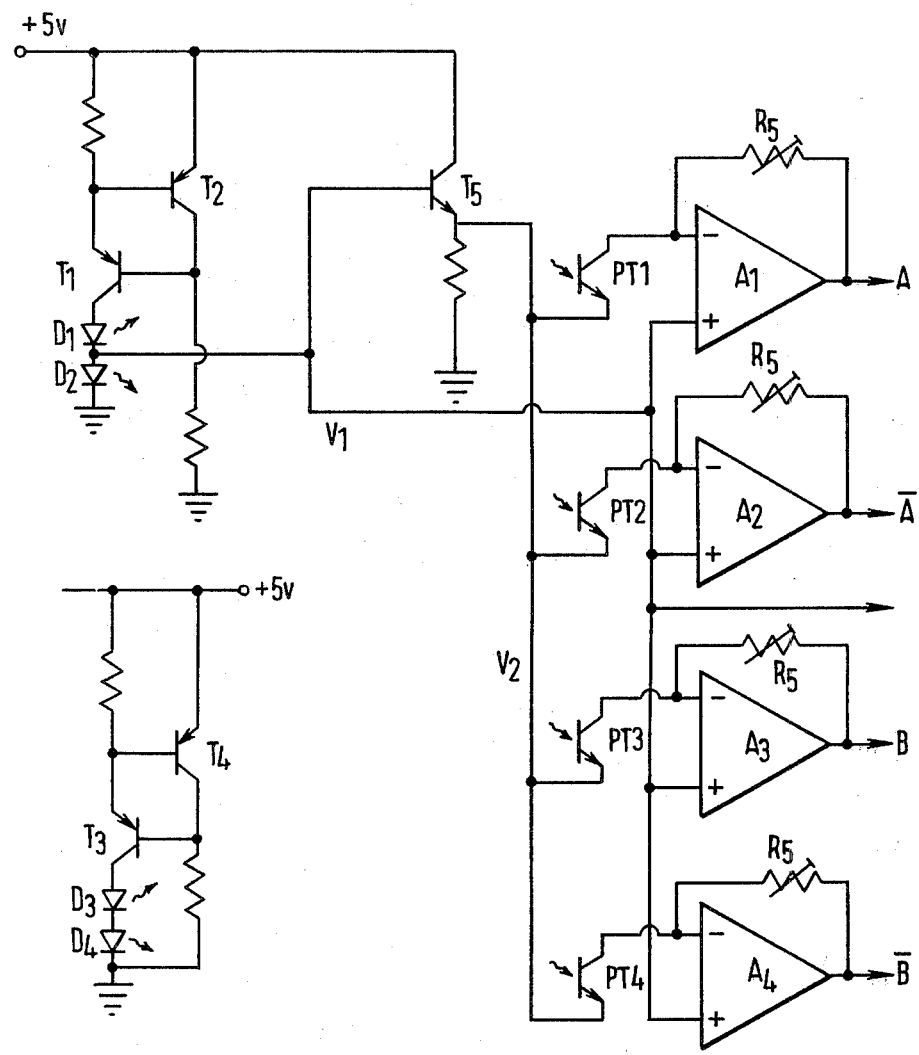
FIG. 1 is a circuit diagram of part of the circuit of a measuring rule which is not incorporated on a main chip.

The measuring rule has a mechanical and an optical system identical to that illustrated and described in our British patent application No. 7,927,071 and includes a measuring member in the form of a coilable steel measuring rule blade 100, which is adapted to be coiled in a conventional manner inside a housing 101, when not in use, and which can be extended through an opening in the housing 101 when it is required to be used as with a conventional measuring rule. The blade 100 is marked along its entire length with a series of regularly spaced apart elements which are dark, light-absorbing transfer strips 102, with the spaces between the dark strips 102 being light-reflecting strips 103. The dark and light-reflecting strips may be black and yellow and are 0.4 mm wide. As with the arrangement illustrated in our Application No. 7,927,071 there are four light emitters and four light sensors, each light emitter being an infra-red diode with a collimating lens and each light sensor being a photo-transistor also each with an external plastic lens. The spacing between the four blocks of cylindrical lenses of the optical system is such that the signal from each light sensor is 90° out of phase with respect to that of each adjacent sensor.

Referring now to FIG. 1, light emitting diodes D1 and D2 are connected in series in a constant current source circuit including transistors T1 and T2 so that the current through the diodes D1 and D2 is nominally 15 milliamps. Similarly, light emitting diodes D3 and D4 are connected in series in a constant current circuit including transistors T3 and T4 again with the currents flowing through the light emitting diodes D3 and D4, being nominally 15 milliamps. An base follower includes a transistor T5, the emitter of which is connected to the anode of a light emitting diode D2, that anode being at a reference voltage V1. The emitter of the transistor T5 is at a further DC reference voltage V2 which has a value 0.6 volts below reference voltage V1. The photo-transistors PT1, PT2, PT3 and PT4, are connected to receive the reference voltage V2, the collectors of the photo-transistors PT1, PT2, PT3 and PT4 being connected to the negative inputs of respective operational amplifiers A1, A2, A3 and A4. The positive inputs to the operational amplifiers A1, A2, A3 and A4 are all connected to receive the reference voltage V1 and each operational amplifier has its output connected to its negative input through a variable resistor R5.

Figure 2:
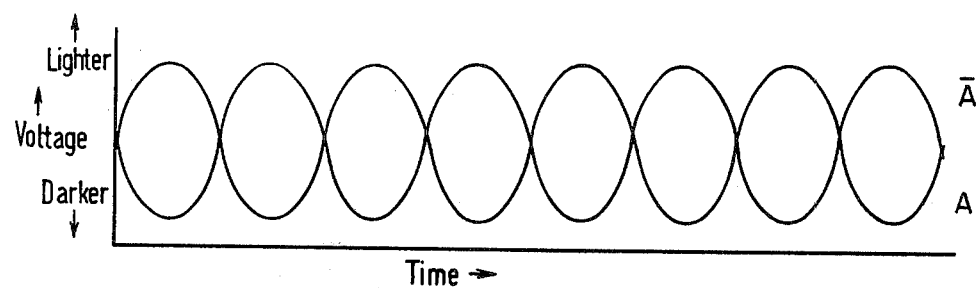
FIG. 2 shows waveforms occurring within the part of the circuit shown in FIG. 1.
Figure 2:
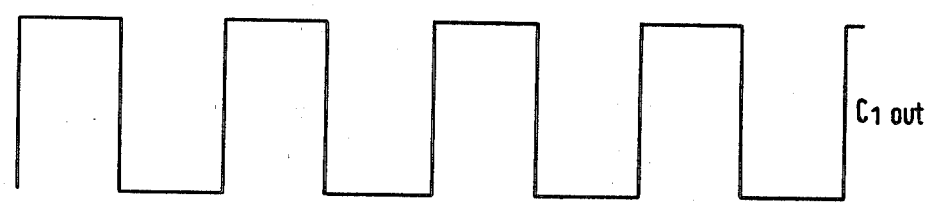
Figure 2:
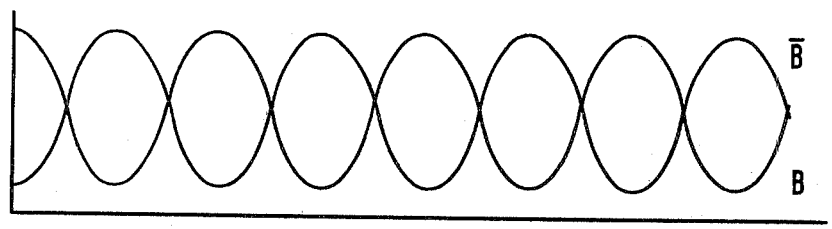
Figure 2:
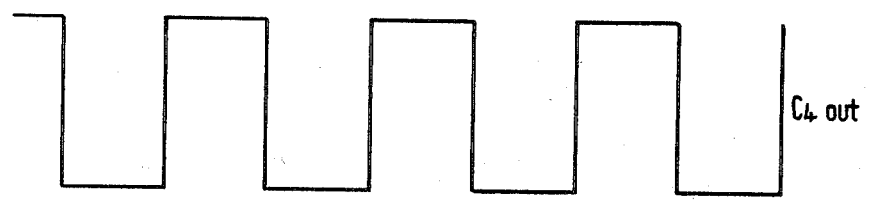

In use, the output current of each photo-transistor is converted into a voltage by the associated operational amplifier, the signal outputs being in the form of sine waves A, B, $\bar{A}$ and $\bar{B}$, as shown in FIG. 2, each sine wave being 90° out of phase to the adjacent sine wave.

The connection of the photo-transistors is such that for each photo-transistor Vce is 0.6 volts and as Vbe is also 0.6 volts its Vcb must be zero volts. This results in a very greatly reduced dark current for the photo-transistor and makes it suitable for use at low light levels. Moreover, the fact that Vce is held constant for each photo-transistor increases the speed of response. In fact, the diodes and photo-transistors which are used, are responsive to infra-red rather than visible range light but they are still referred to as light emitters and sensors in this specification.

Figure 3:
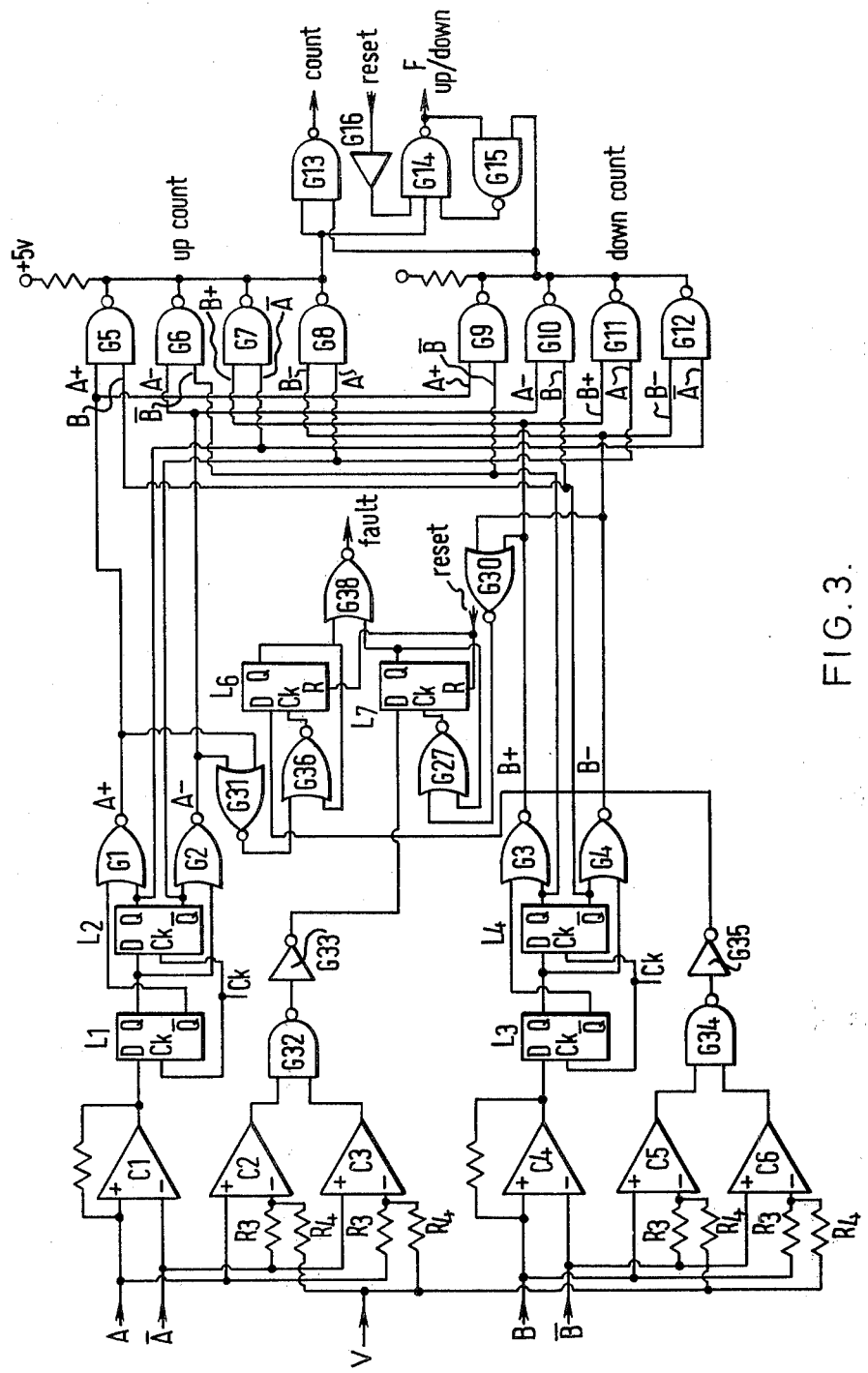
FIG. 3 is a circuit diagram of a part of the circuit of the measuring rule which is formed on a main chip and includes a count generator and fault detector.
Figure 4:
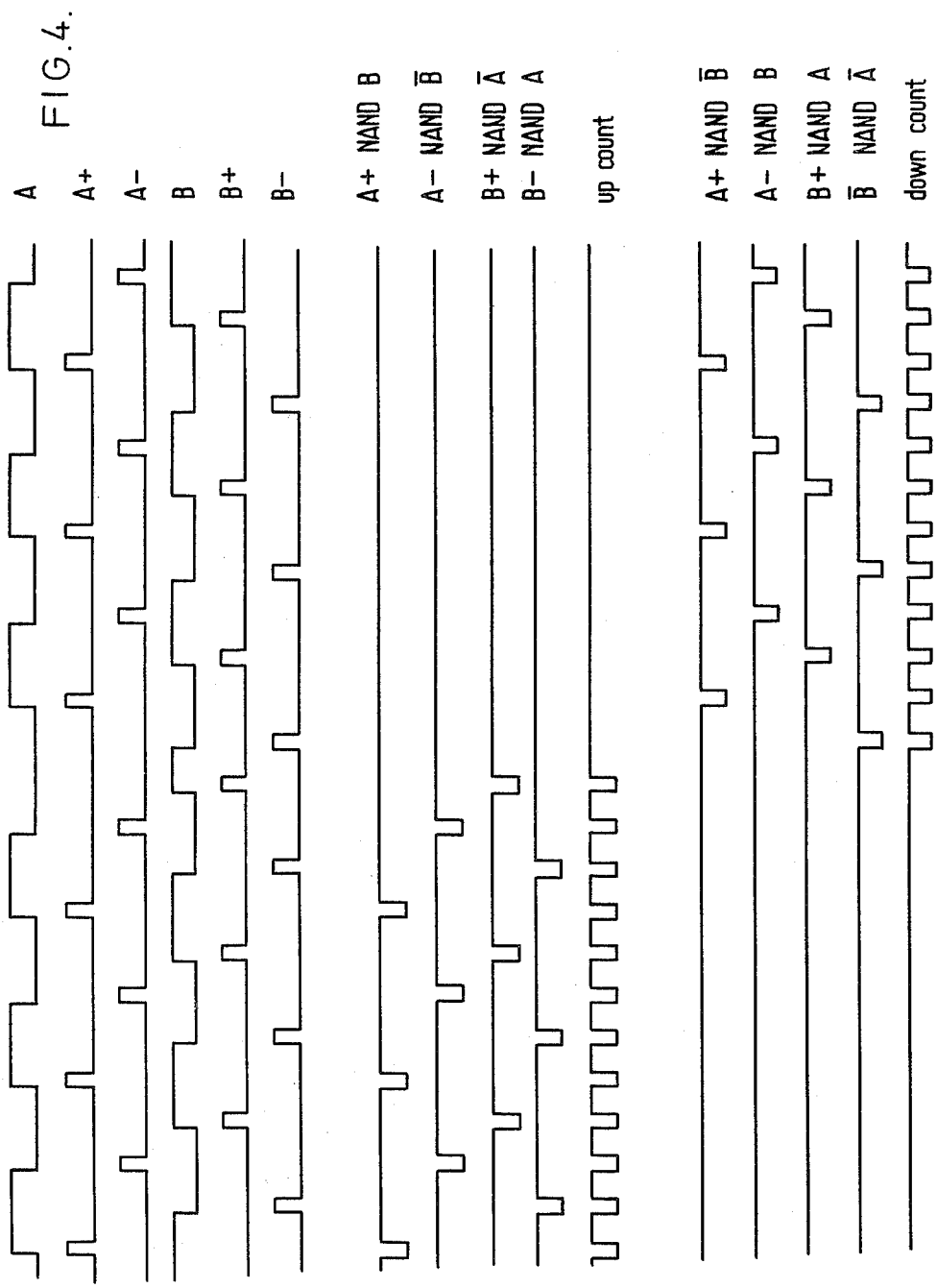
FIG. 4 shows waveforms occurring within the part of the circuit shown in FIG. 3.

Turning now to FIG. 3, waveforms A and $\bar{A}$ are fed to comparator C1 whereas waveforms B and $\bar{B}$ are fed to comparator C4 to produce square waves shown in FIG. 2 as the outputs of C1 and C4 and which are 90° out of phase. As stated earlier, the width of each black and yellow stripe is 0.4 mm with the result that a complete cycle of each of the waveforms C1 and C4 corresponds to 0.8 mm. It is desired to produce an output pulse for every 0.1 mm and to do this, the count generator produces a short pulse for every edge in waveforms C1 and C4 and a count doubler is used to double each output pulse. The manner in which a pulse is produced for each edge in the output of C1 will now be described. The output of C1 is fed to the D input of a D-type bistable L1 whose Q output is connected to the D input of a further D-type bistable L2. Clock inputs of bistables L1 and L2 receive a clock pulse at a frequency of say 500 KHz; $\bar{Q}$ output of bistable L1 and the Q output of bistable L2 are connected to the inputs of a NOR gate G1 whereas the Q output of the bistable L1 and the $\bar{Q}$ output of the bistable L2 are fed to the inputs of a NOR gate G2. The $\bar{Q}$ output of the bistable L2 will be similar to that of the bistable L1 with a delay and the same applies to the Q outputs of the bistables L1 and L2. As a result the output of the NOR gate G1 is a single pulse one clock period long produced whenever a positive edge exists in waveform A. Similarly, the output of NOR gate G2 will be a single pulse, one clock pulse period long whenever a negative edge exists on waveform A. The outputs of NOR gates G1 and G2 are denoted by A+ and A− respectively. A similar circuit utilising D-type bistables L3 and L4 and NOR gates G3 and G4 is connected to the output of the comparator C4 and produces outputs B+ and B− in response to the positive and negative going edges in the output of C4. Because the outputs of C1 and C4 should normally be in phase with A and B respectively, the outputs of C1 and C4 are in fact denoted by A and B respectively in FIG. 4 which shows waveforms A, A+, A−, B, B+ and B−. The purpose of providing both A and B is primarily to detect the direction of motion of the measuring blade although as has already been described, both A and B are utilised for count purposes in the manner which will be described in more detail later. In FIG. 4 the parts of the waveforms of A, A+, A−, B, B+ and B− to the left of the direction change line are for an up-count that is to say a positive relative movement of the measuring blade whereas those parts of those waveforms to the right of the direction change line are for a down-count, that is for negative movement of the blade.

For the purposes of both counting and detection of direction, the fixed waveforms of A, $\overline{A}$, A+, A−, $\overline{B}$, B, B+ and B− are gated by NAND gates G5 to G12 in the following manner:

| GATE | ACTION |
| --- | --- |
| G5 | A+ NAND $\underline{B}$ |
| G6 | A− NAND $\underline{B}$ |
| G7 | B+ NAND A |
| G8 | B− NAND $\underline{A}$ |
| G9 | A+ NAND B |
| G10 | A− NAND B |
| G11 | B+ NAND $\underline{A}$ |
| G12 | B− NAND A |

The outputs of the NAND gates G5 to G8 are all wired together and to one input of a NAND gate G13 whereas the outputs of the NAND gates G9 to G12 are wired to the other input of the NAND gates G13 which acts to add its inputs together. For the inputs of the group of NAND gates G5 to G12, the signals A, $\overline{A}$, B and $\overline{B}$ are derived from the outputs of the bistables L2 and L4.

By consideration of FIG. 4, it will be seen that NAND gates G5 to G8 only produce outputs during an up-count whereas NAND gates G9 to G12 only produce outputs during a down-count. The output of the NAND gate G13 consists of what is shown in FIG. 4 as the "up-count" plus what is shown as the "down-count". The output of G13 is applied to the count input of a counter which also has an up/down control line. To produce signals to control the up/down control line, the outputs of the NAND gates G5 to G8 are also connected to one input of a three input NAND gate G14 which, together with a NAND gate G15 constitutes a bistable producing an up/down output signal denoted by F. The outputs of NAND gates G9 to G12 are all connected to one input of a NAND gate G15, the other input which receives the signal F and whose output is connected to a further input of the NAND gate G14. The third input of the NAND gate G14 receives a reset signal from the counter which will be described shortly through an inverter G16. The output of the bistable formed from the NAND gates G14 and G15 will be high if the last pulse was up and low if the last pulse was down. If the counter is arranged to operate after the leading edge of the count pulse, the bistable constituted by G14 and G15 will have to be set to either up or down by the time a count is made, as will be appreciated.

Figure 5:
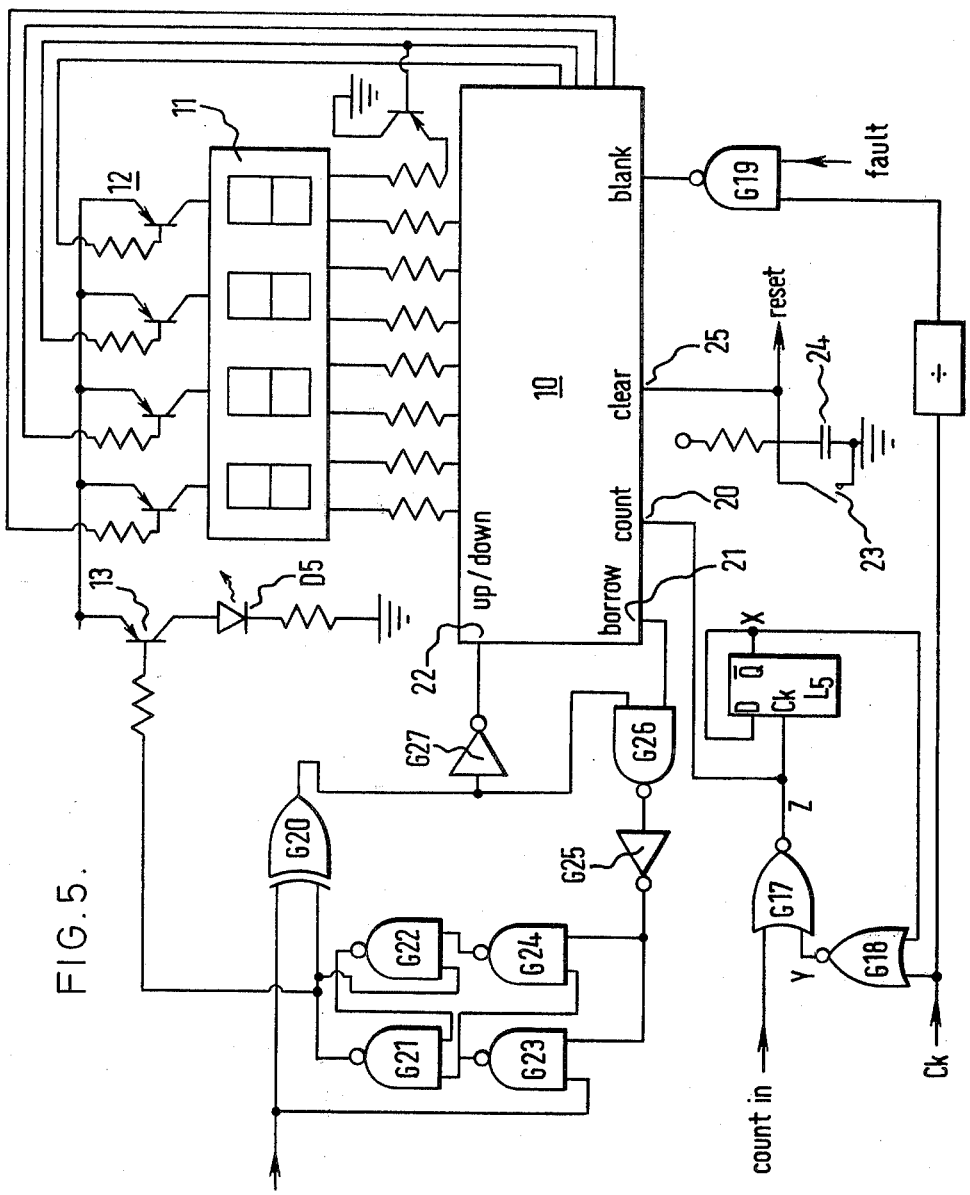
FIG. 5 is a diagram of a further part of the circuit of the measuring rule which is on the main chip and includes a doubler, reflector round zero and counter stroke display circuitry.
Figure 6:
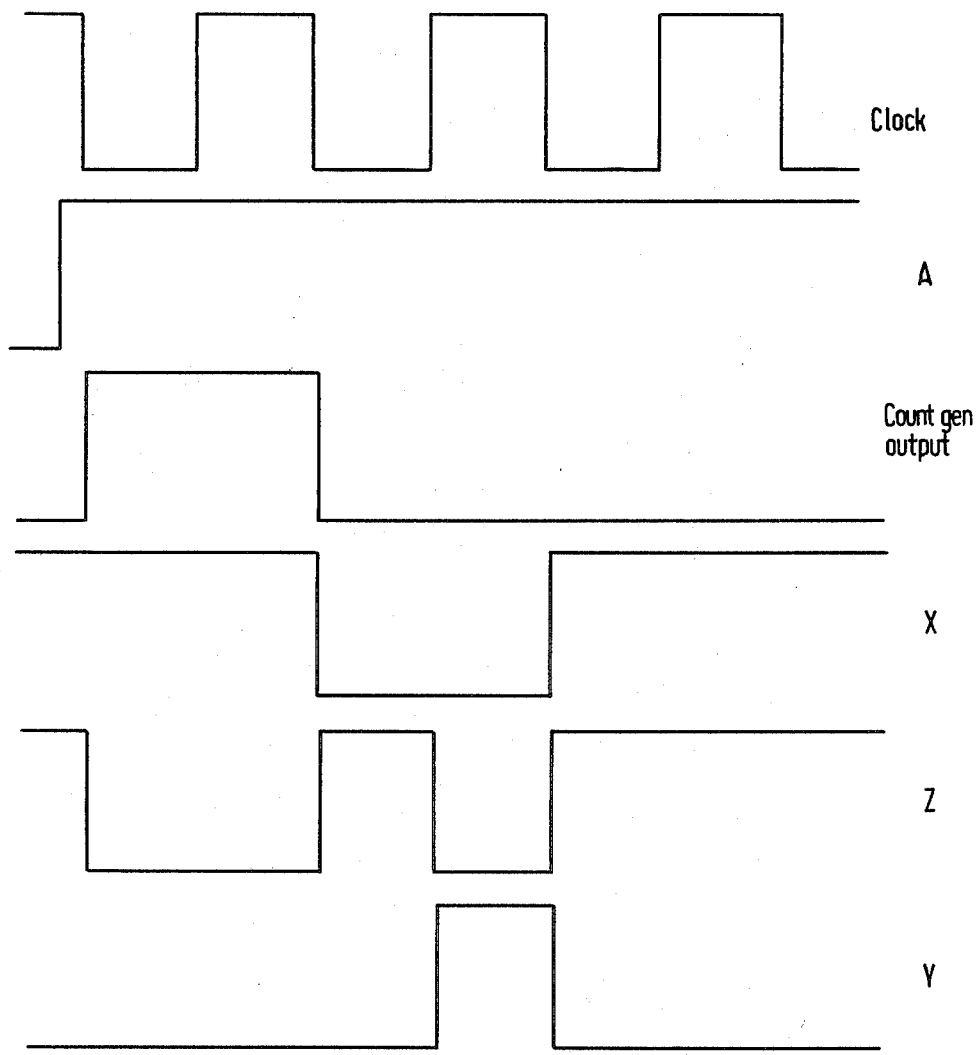
FIG. 6 shows waveforms of the count doubler shown in the part of the circuit illustrated in FIG. 5.

The output pulses F are doubled by the pulse doubler shown in FIG. 5 and then passed to the counter 10, also shown in FIG. 5. As has already been explained, as a pulse appears at the output signal F for every 0.2 mm movement of the rule blade, it is necessary to generate two pulses for every pulse in the count output of the G13 in order to keep the display reading in mm. For this purpose, the count signal is applied to one input of a NOR gate G17, the output of which is fed as a clock pulse to the clock pulse input of the D-type bistable L5. The $\overline{Q}$ output of the bistable L5 is firstly fed to its D input and secondly to one input of a NOR gate G18, the other input of which receives a clock pulse and whose output is fed to the other input of the NOR gate G17. The $\overline{Q}$ output of the bistable L5, the output of the gate G18 and the output of the gate G17 are denoted by X, Y and Z respectively, output Z being the output of the circuit and being two pulses for every input pulse as can be seen from the waveform shown in FIG. 6. Normally, $\overline{Q}$ of bistable L5 is at level high, which inhibits NOR gate G18 so that the clock pulses received at the other input of the NOR gate G18 have no effect. When a count pulse arrives at NOR gate G17 from the count generator gate G17 switches back in state at the end of the pulse. The trailing edge then occurring in waveform Z causes bistable L5 to change state, which results in gate G18 ceasing to be inhibited. The next clock pulse applied to gate G18 passes through gate G17 and thus appears in waveform Z and its trailing edge resets the bistable L5 which then again inhibits gate G18. The net effect is that one clock pulse from the clock generator of the system is counted in addition to each pulse received by the pulse generator.

The waveform Z is applied to the count 20 of the counter 10 whose output is applied to a display 11 through a group of transistors 12. The display 11 includes a light-emitting diode D5 which then energised illuminates a -ve sign and is controlled through a transistor 13 by circuitry which also controls the direction of count of the counter 10. This circuitry is referred to as a reflect around zero circuitry and one of its functions is to make the counter, when counted down to follow the sequence 2, 1, 0, −1, −2 instead of the sequence of 2, 1, 0, 9999, 9998. For this purpose, a carry/borrow output 21 of the counter 10 is utilised and this output is a function of the counter design and is high only when the count is 0000 and the counter is counting down or when the count is 1111, and the counter is counting up. Thus, normally the carry/borrow output 21 is low and this output is applied through a NAND gate G26 and an inverter G25 whose output is thus also normally low. The output of inverter G25 is connected to corresponding inputs of NAND gates G23 and G24 whose outputs are connected to opposite inputs of NAND gates G21 and G22 connected together to form a bistable. The output of NAND gate G23 is also connected to the other input of NAND gate G24 whereas the other input of NAND gate G23 receives the directional control signal F. The directional control signal F and the output of NAND gate G21 which constitutes the output of the bistable formed of NAND gates G21 and G22 are connected to the inputs of a gate G20. The output of the gate G20 is firstly connected via an inverter G27 to the up/down control 22 of the counter 10 and secondly to the other input of the NAND gate G26. In normal operation if the carry-borrow signal is low and thus the output of inverter G25 is low, gates G23 and G24 are inhibited with the result that the state of the bistable formed by gates G21 and G22 cannot be changed. For reset purposes, a switch 23 is connected across a capacitor 24 connected between earth and a clear input 25 of the counter 10.

On switch on the reset pulse produced across the capacitor 24 is fed to gate G16 and ensures that the output of the gate G14, that is waveform F is in the high state. The bistable constituted by gates G21 and G22 can be in either state on switch on and it will be first assumed that the output of the gate G21 will be high with a consequent result that the output of inverter G27 will be high corresponding to an up-count; the output of that inverter is connected to input 22 as has already been stated. If then the blade is extended the counter 10 will count up with the bistable shown in FIG. 5 remaining in the state described. If the blade of the rule is then pushed back into its case, the bistable constituted by gates G14 and G15 will reverse its state and consequently the level of signal F will become low. This is of course applied to gate G20 so that its output will go high and the output of the inverter G27 will go low causing the counter 10 to count down as is required. The apparatus will continue to count down until the count reaches 0000 and at this point the signal applied to the carry/borrow output 21 will go high. As a result, the output of the inverter G25 will go high. The inputs to the gates G23 and G24 will then ensure that the output of gate G23 is high whereas that of gate G24 is low. This changes the state of the bistable constituted by gates G21 and G22 and the output of gate G21 goes low. As a result of the output of gate G21 going low, the output of gate G27 will change to the high state and the counter will begin to count up again. Also, the output of gate G21 which is connected to the transistor 13 energises the diode D5 and ensures that the negative sign is illuminated.

If on switch on the state of the bistable constituted by gates G21 and G22 is such that the output of gate G21 is in its low state on starting of an up-count the output signal via gate G26 ensures that that bistable switches its state.

FIG. 5 also shows the drive for the display 11 but as this is conventional no further description will be given.

Referring now again to FIG. 3, the fault detection circuit of the apparatus will now be described. The mode of operation of the fault detection circuit is that the count signals of each channel are used to sample the actual signals of the other channel.

In detail, the outputs of gates G1 and G2, that is to say signals A+ and A− are both fed to NOR gate G31 whose output therefore consists of A+ and A− as shown in FIG. 4. These signals occur approximately in line with the maximum values of the signals B and $\bar{B}$ of the other channel. Similarly, the outputs of the gates G3 and G4 that is to say the signals B+ and $\bar{B}$− are both fed to a NAND gate G30 whose output therefore consists of the signals B+ and B− as shown in FIG. 4 which occur at the maximum values of the signals of channel A.

Each of the signals A, $\bar{A}$, B, $\bar{B}$ is magnitude divided by a voltage divider consisting of two resistors R3 and R4 connected in series between that signal and a reference voltage V. Assuming the reference ratio is n this therefore produces the signals nA, n$\bar{A}$, nB, and n$\bar{B}$. Signals A and n$\bar{A}$ are fed to the inputs of a comparator C2, signal $\bar{A}$ and nA are fed to the inputs of a comparator C3, signals B and n$\bar{B}$ are fed to the input of inputs of a comparator C5 and signals $\bar{B}$ and nB are fed to the inputs of a comparator C6. The outputs of comparators C2 and C3 are gated by a NAND gate G32 whereas the outputs of gates C5 and C6 are gated by a NAND gate G34, the outputs of gates G32 and G34 being inverted by inverters G33 and G35 respectively. Considering the comparison effected on the signals on the A channel, the factor n is chosen so that n$\bar{A}$ at its maximum will always be greater than the corresponding minimum of the signal A which occurs simultaneously and similarly nA at its maximum will always be greater than the corresponding minimum of the signal $\bar{A}$ which occurs simultaneously. As a result, one of the outputs of the comparator C2 and C3 will always be at zero volts so that the output of gate G33 remains low. Similarly assuming there is no fault the output of gate G35 will remain low if the B channel signals are satisfactory. The output of gate G33 is fed to the D input of a D-type bistable L7; the Q output of bistable L7 is fed to one input of a gate G38 and is also fed to one input of a gate G27, the other input of which receives the output of the gate G27. The output of the gate G30 is utilized as the clock pulse of the bistable L7. In similar manner, the output of gate inverter G35 is fed to the D input of bistable L6 whose Q output is fed to the other input of gate G38 and to one input of a gate G36 which also receives the output of the gate G31. Again the output of G36 is utilized as the clock input of the bistable L6.

Figure 7:
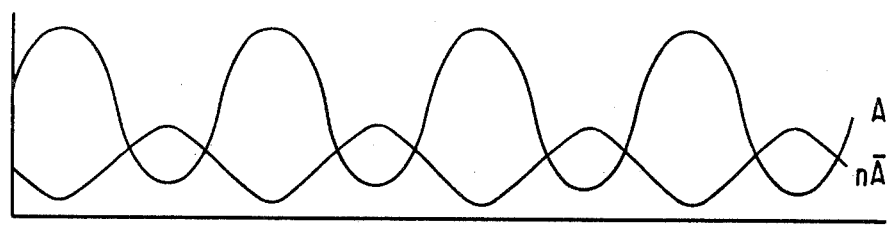
FIGS. 7, 8, 9 and 10 are all waveforms illustrating the operation of the error detector shown in FIG. 3.
Figure 7:
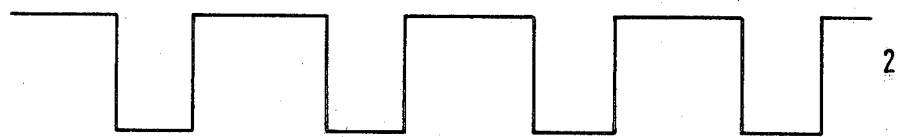
Figure 7:
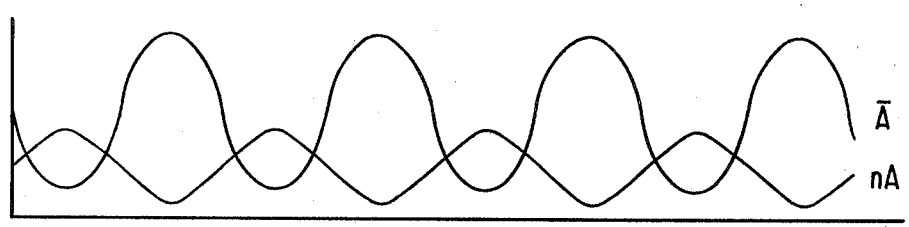
Figure 7:
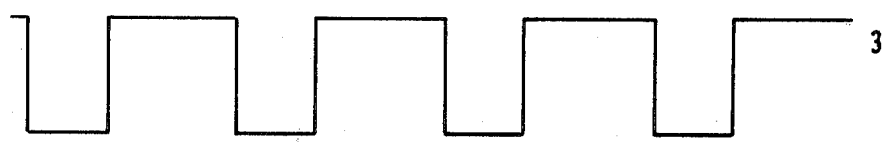
Figure 8:
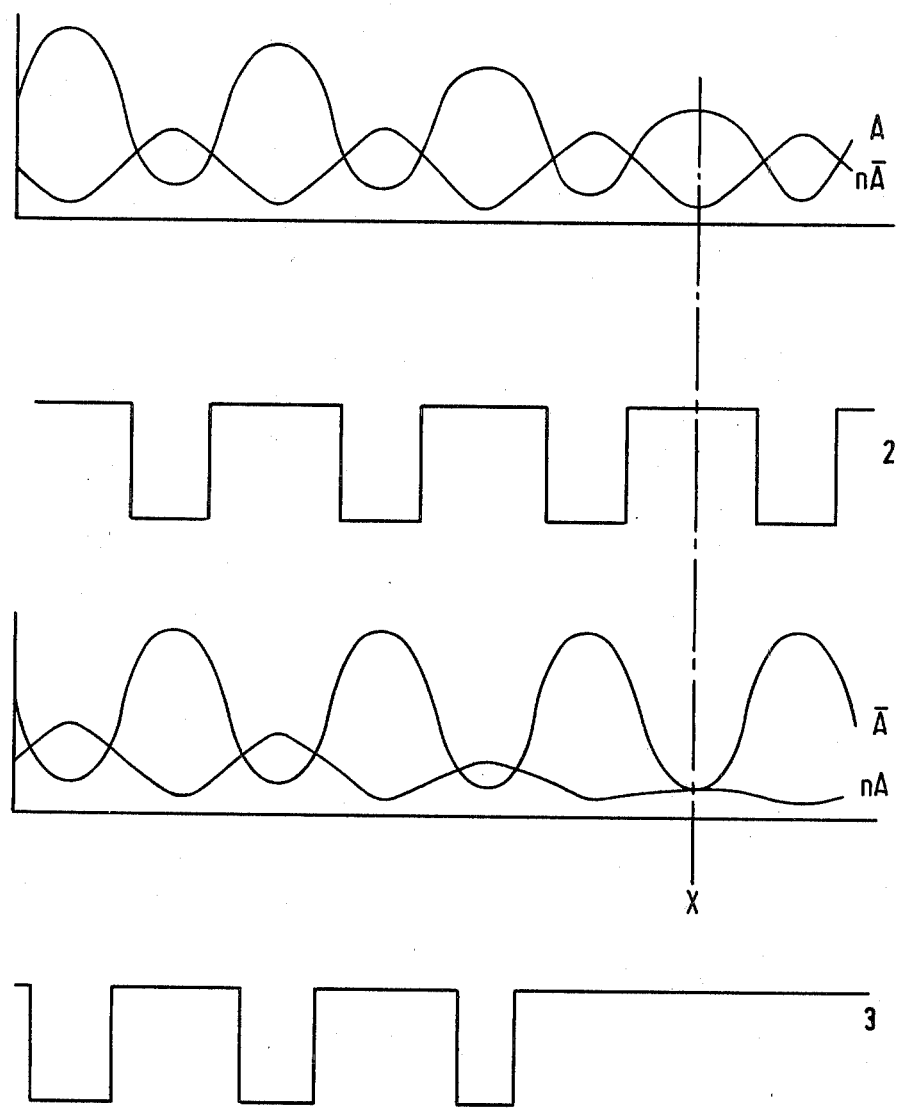

As has already been explained in normal operation, the outputs of inverters G33 and G35 are low when a clock pulse arrives and bistables L6 and L7 are not affected at all. Assuming now that a fault occurs because a large piece of dirt is adhered to the blade forming a black area on the blade. It will be assumed that this mechanical black area reaches the sensor in channel A first and has the affect of reducing the amplitude of sine wave A and also of sine wave nA. This is a situation illustrated in FIG. 8. As the black area gradually moves into the area of channel A, the sine wave A will gradually reduce in amplitude and eventually the situation will be reached, as designated at X in FIG. 8, that the maximum of signal nA is less than the simultaneous minimum of the signal $\bar{A}$. When this happens the outputs of comparators C2 and C3 are simultaneously high with the result that the output of inverter G33 is high. As has already been explained, an output pulse will occur at the output of gate G30 at the time of the maximum of the channel A and consequently, bistable L7 will be clocked while its D input is at high. Consequently, bistable L7 will change state and a fault output will be produced by gate G38 and bistable L7 will remain in that state until reset for which purpose a reset line is connected to it as it is to bistable L6. FIG. 7 illustrates the corresponding waveforms where no fault occurs.

Since nA is always less than A by definition, the fault signal output will always be triggered before the actual fault is such as to cause malfunctioning of the equipment.

Figure 9:
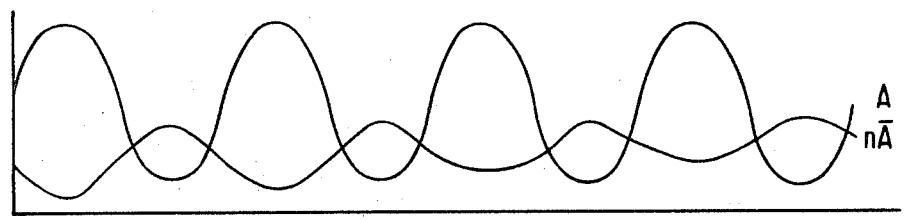
Figure 9:
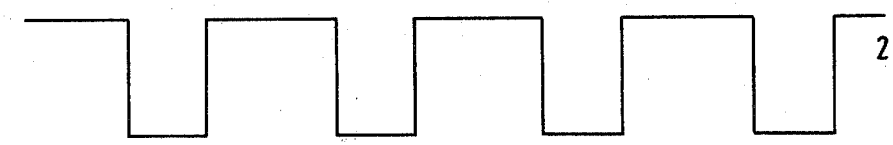
Figure 9:
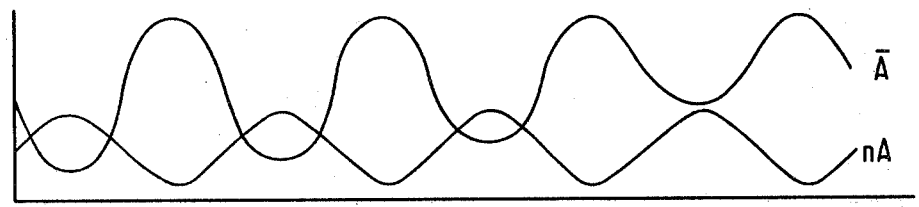
Figure 9:
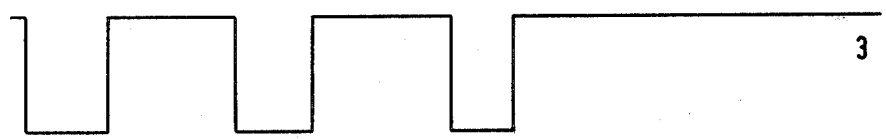

The fault detection circuit will work equally well in the circumstance when one of the black lines or plurality of black lines is missing and this is illustrated by FIG. 9. If a number of dark marks are missing, the D.C. level of the signals will rise and the amplitude of the sine waves decrease as the area of the missing marks moves under each sensor. In this example, it will be assumed that this happens to signal $\bar{A}$. As the D.C. level of $\bar{A}$ rises and the A.C. amplitude declines, there will be a point in which the minimum of $\bar{A}$ ceases to be smaller than the instantaneous maximum of nA. When this happens, the output of gate G33 goes high and a fault is indicated as previously described.

It should be appreciated that the fault detection system which has been described will work with any amplitude of signal without any change to the components provided that the nominal value of the output signals of the four sensors is the same. This is because the limits of the amplitude are defined by the operating limits of the operational amplifiers and is a very useful feature for absorbing production problems.

In practice, the hysteresis applied to comparators C1 and C2 and the reference voltage of all the comparators define the minimum signal which can be considered as reliable. Although it is difficult to envisage a condition in which all four channels are so affected that the output signals fall simultaneously, nevertheless, the circuit is designed to accommodate this. If all four signals are increased in level by a small D.C. voltage as the A.C.

amplitudes fall, the D.C. voltage becomes increasingly more significant until the position is reached as shown in FIG. 9 in which nA is less than $\bar{A}$ at the maximum of nA, even though A and $\bar{A}$ are identical in amplitude about 180° out of phase. In order to provide this D.C. potential which might be termed a pedastal, the end of each voltage divider constituted by the end of resistor R4 remote from the comparator is connected to a reference voltage which can conveniently be the emitter of transistor T5 shown in FIG. 1.

Figure 10:
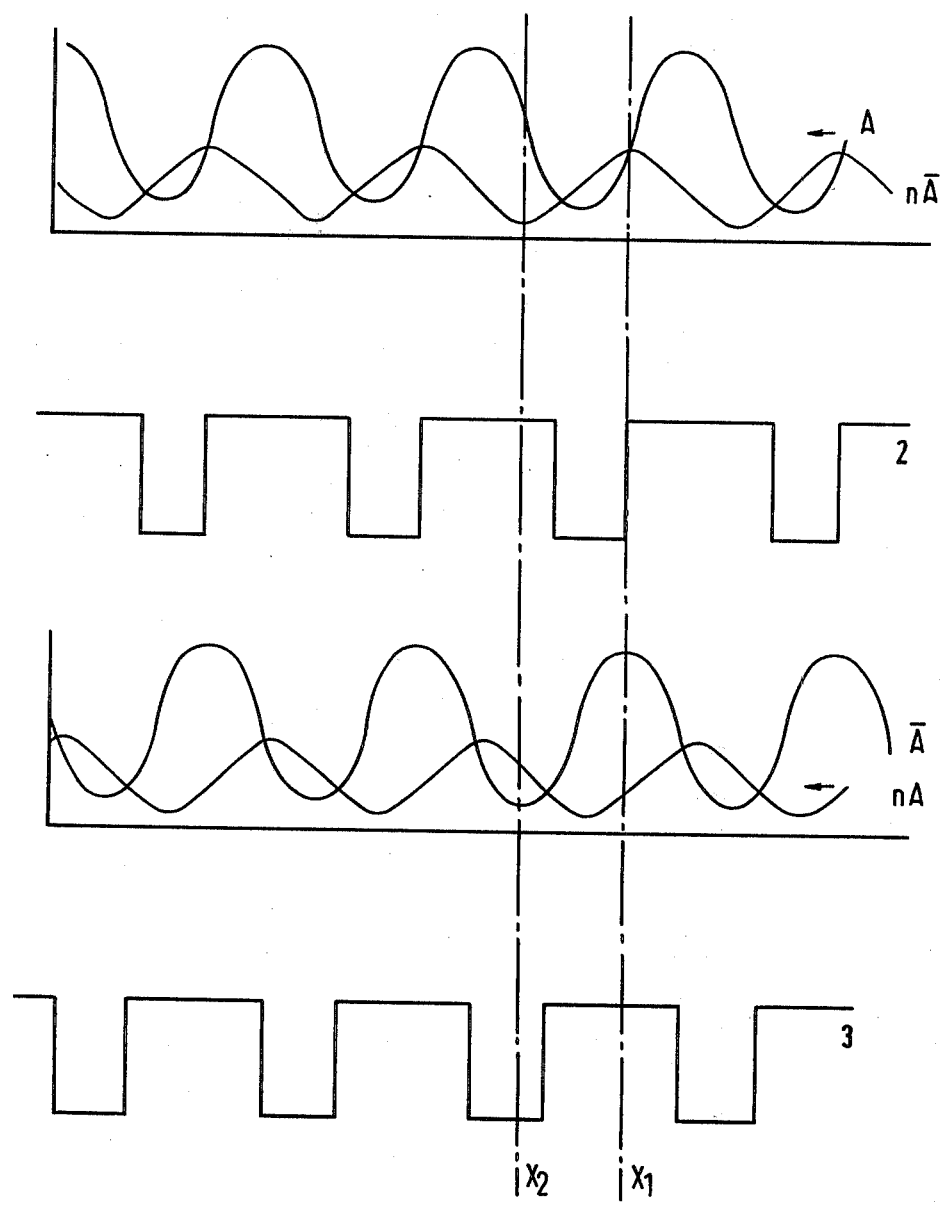
Figure 11:
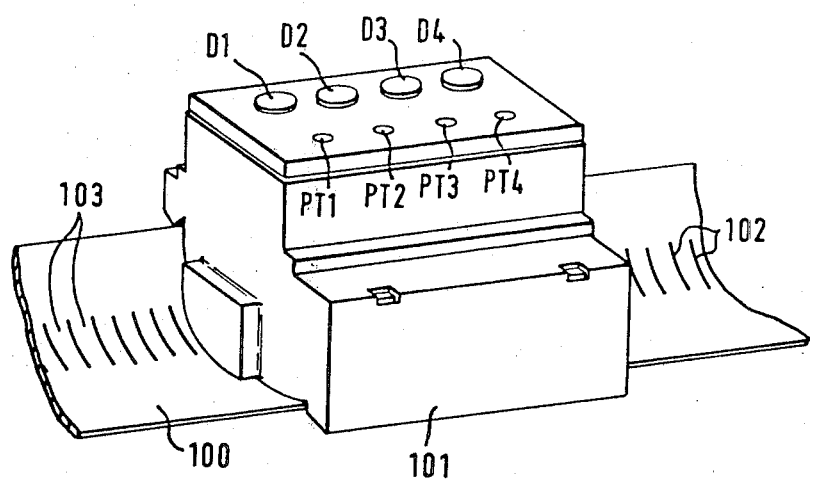
FIG. 11 is a perspective view of the measuring rule and its optical assembly.

The fault detection circuit shown as part of FIG. 3 will also detect shifts in the relative phase of the signals which might occur due to lines being printed on the tape incorrectly, e.g. during slippage, during printing. The way this is detected will now be explained with reference to FIG. 10, in which it is assumed that signal A is shifted by 90° but that signals $\bar{A}$, B and $\bar{B}$ remain in the same phase and the amplitude of all four signals does not change. As can be appreciated the outputs of comparators C2 and C3 change at different points because of the phase shift firstly because of the phase shift between A and $\bar{A}$ and secondly because of the phase shift between nA and $\bar{A}$. As a result, comparators C2 and C3 will be simultaneously positive for a short period but again no fault signal will be produced unless this occurs simultaneously with one of the sampling pulses generated from the channel B. If A in fact moves by 90° then the cross over points of A and $\bar{A}$ will in fact move by less than 90° and there will be no fault detected as the sampling pulse of point X1 occurs just before the moment when both comparators produce a positive output. At X2 clearly no fault will be detected. If however A and $\bar{A}$ are not absolutely identical in amplitude, then sampling at point X1 will in fact detect a fault. If a phase shift of B in the opposite direction to a phase shift in A occurs, which would in fact be a fault likely to cause a counting error, then the sampling positions from channels B move X2 and X1 to the right causing a fault signal to be detected.

In effect, an error of phase or amplitude either of which itself may not be sufficient to cause a fault detection may in combination cause a fault detection, this is advantageous as such a condition may give rise to a counting error. The fault detection may be utilized to cause a flashing display.

|  |  | Device type | Manufacturer |
|---|---|---|---|
| FIG. 1 | $T_1$ to $T_4$ | BC214 | Texas |
|  | $T_5$ | BC184 | Texas |
|  | $D_1$ to $D_4$ | TIL32 | Texas |
|  | $A_1$ to $A_4$ | LM324 | National |
|  | $PT_1$ to $PT_4$ | LPT100A | Litronic |
| FIG. 3 | $C_1$ to $C_6$ | LM339 | National |
|  | All NAND gates and inverters | MC14011 | Motorola |
|  | All NOR gates | MC14001 | Motorola |
|  | $L_1$ to $L_7$ | MC14013 | Motorola |
| FIG. 5 | All NAND gates and inverters | MC14011 | Motorola |
|  | All NOR gates | MC14001 | Motorola |
|  | $L_5$ | MC14013 | Motorola |
|  | $G_{20}$ | MC14077 | Motorola |
|  | Transistors | BFR81 | Texas |
|  | Display 11 | NSB5882 | National |
|  | Counter 10 | ZN1040E | Ferranti |
|  | D.p. driver | BC184 | Texas |
|  | Divider | MC14020 | Motorola |

We claim:

1. A displacement measuring system comprising a pair of sensors arranged in fixed relationship to each other; a member which is relatively movable in relation to each sensor and which is arranged to be sensed by each sensor so that relative movement of the member in a given direction produces a number of cyclical variations of a signal output from each sensor, the number being proportional to the magnitude of the relative movement; the sensors being substantially 180° out of phase with each other so that when the signal from each sensor is at its high value the signal from the other sensor is at its low value and vice versa; difference measuring means connected to the sensors for producing a difference signal in dependence on the signals of the sensors; counting means connected to the difference measuring means and responsive to the difference signal for counting its cycles to determine the magnitude of relative movement of said member; and sampling means for sampling the signals from the two sensors during the time that one is at its high value and the other is at its low value and vice versa and for generating a fault signal if the ratio of the magnitudes of the two signals at a sample lies outside a predetermined range.

2. A system as claimed in claim 1 wherein said sensors are light sensors and said member cyclically modifies the light received by said sensors.

3. A system as claimed in claim 2 wherein said member is provided with a series of light transmitting regions alternating with a series of dark regions.

4. A system as claimed in claim 2 wherein said member is provided with a series of light-reflecting regions alternating with a series of non-reflecting regions.

5. A system as claimed in claim 1 which comprises at least one further pair of sensors which are arranged in a fixed relationship to each other and which sense the member so that relative movement of the member in said given direction causes cyclical variations in a signal output of each sensor of each further pair equal in number to the cyclical variations of the signal output of each of the first-mentioned sensors, sensors of mutually different pairs being out of phase with each other by a phase angle different from 0° and 180°; difference measuring means being provided for each pair of sensors; and direction detecting means connected to each difference measuring means for determining the direction of relative movement of the member.

6. A system as claimed in claim 5 wherein the sensors are four in number and are arranged in two pairs, one pair being in phase quadrature relationship with the other pair.

7. A system as claimed in claim 6 wherein said sampling means is triggered to take a sample for one pair of sensors in response to a change in polarity of the difference signal produced by the difference measuring means connected to the other pair of sensors.

8. A system as claimed in claim 6 wherein the sampling means comprises a voltage divider connected between the output of each sensor of each pair and a common reference potential, the voltage dividers being similar, and, for each pair of sensors, means for generating a sampling signal when the difference signal of that pair of sensors changes state, first and second comparators, said first comparator being connected to receive the output of one sensor of the pair and the output of the voltage divider connected to the other sensor of the pair and the second comparator being connected to receive the output of the said other sensor of the pair and the output of the voltage divider connected to the said one sensor of the pair, and sensing means for sensing when the outputs of the two comparators associated with that pair of sensors have the same state at the instant of generation of the sampling signal associated with the other pair of sensors.

9. A system as claimed in claim 1, wherein the sampling means comprises a voltage divider connected between the output of each sensor and a reference voltage, the voltage dividers being similar, and first and second comparators, the first comparator being connected to receive the output of one sensor and the output of the voltage divider connected to the other sensor, the second comparator being connected to receive the output of the said other sensor and the output of the voltage divider connected to the said one sensor, means for detecting when the output of either of the sensors is at a maximum while the other is at a minimum, and for producing a sampling signal when that occurs, and means for detecting when the outputs of the two comparators have the same state in the presence of a sampling signal.

* * * * *